United States Patent
Scholler

[11] Patent Number: 5,951,237
[45] Date of Patent: Sep. 14, 1999

[54] DEVICE FOR LIFTING, PIVOTING, AND ROTATING A HEAVY PIECE OF EQUIPMENT

[75] Inventor: Johann Scholler, Eppertshausen, Germany

[73] Assignee: Leybold Systems GmbH, Hanau, Germany

[21] Appl. No.: 08/886,371

[22] Filed: Jul. 1, 1997

[30] Foreign Application Priority Data

Jul. 13, 1996 [DE] Germany ............................ 196 28 316

[51] Int. Cl.[6] .................................................. B66C 23/00
[52] U.S. Cl. ..................... 414/684.3; 414/411; 53/381.4; 422/297; 422/300; 422/302
[58] Field of Search ......................... 414/10, 411, 684.3; 53/381.4; 422/297, 300, 302

[56] References Cited

U.S. PATENT DOCUMENTS

| | | | |
|---|---|---|---|
| 4,367,199 | 1/1983 | Jericho | 422/110 |
| 4,535,585 | 8/1985 | Gardos | 53/381.4 |
| 4,708,764 | 11/1987 | Boden et al. | 156/617 R |
| 4,821,783 | 4/1989 | Arnemann | 53/381.4 |
| 4,884,938 | 12/1989 | Fujita et al. | 414/684.3 |
| 4,979,350 | 12/1990 | Arnemann | 53/381.4 |
| 5,048,259 | 9/1991 | Cox et al. | 53/381.4 |

FOREIGN PATENT DOCUMENTS 2583032  12/1986  France .................... 53/381.4

*Primary Examiner*—James W. Keenan
*Assistant Examiner*—Douglas Hess
*Attorney, Agent, or Firm*—Fulbright & Jaworski, LLP

[57] ABSTRACT

In a device for lifting, pivoting and rotating the cover (5) of a vacuum container (14) of a crystal drawing apparatus, the device being equipped with a bolt (26) held by a stationary part (15) of the apparatus and extending vertically upward, a sleeve (24) being provided with projections (34,34'), which are permanently attached to it and which extend horizontally from it, the device also being provided with a pair of bolts (34,34'), and with a sleeve component (28), which is pivoted on the bolts (36,36'), whereby parallel to the sleeve component (28) a screw bolt (37) is sustained in the housing (35). A hand lever (21) is fixed on the screw bolt (37), which is connected with a screw nut (38), which supports itself on the rotary sleeve (24), where the sleeve component (28) surrounds a journal (27), which is permanently connected to the device part or to the cover (5).

9 Claims, 2 Drawing Sheets

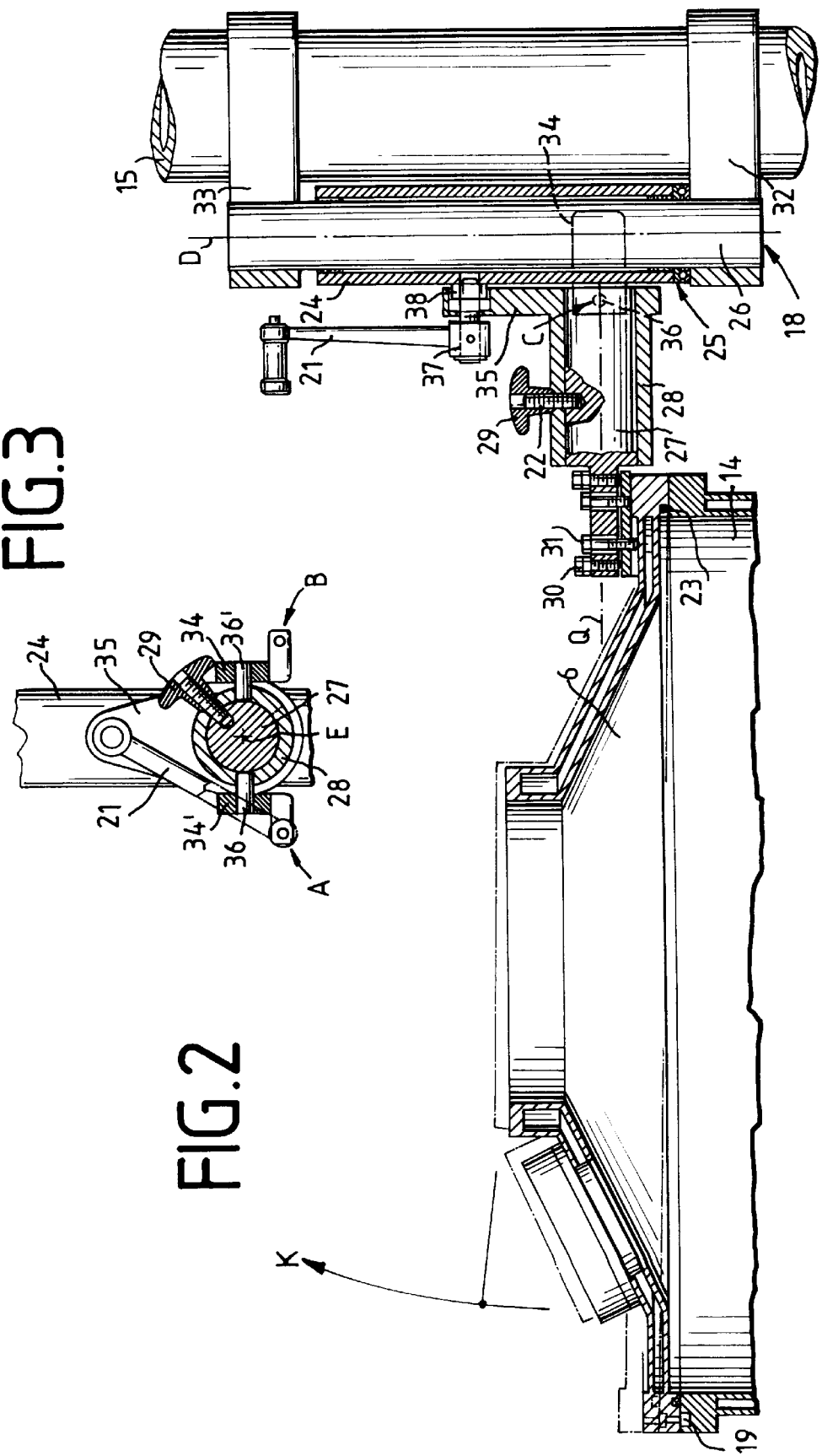

DEVICE FOR LIFTING, PIVOTING, AND ROTATING A HEAVY PIECE OF EQUIPMENT

BRIEF DESCRIPTION OF THE INVENTION

The invention pertains to a device for lifting, pivoting, and rotating a heavy piece of equipment, especially the cover of the vacuum tank of a crystal drawing apparatus, the device being provided with an arm or bolt which is held by a stationary part of the apparatus and which projects vertically upward.

BACKGROUND OF THE INVENTION

Apparatuses for drawing crystals usually include a framework or support structure of metal pipes or metal sections, to which the assemblies required for the drawing process, e.g., the vacuum chamber, the transfer lock, the lock chamber, and the drawing element, are attached.

Thus, an apparatus for zonal melting without a crucible is known (DE 1,290,117), which consists of a two vertical guide columns, which are mounted on a pedestal and which are connected at the top by a transverse strut. The columns carry two arms with the rod holders; the arms can be moved relative to each other and relative to a stationary heating device. The arms are coupled to a differential gear, and the two guide columns are equipped with support elements, which are attached at the top by means of screw threads to the transverse strut and at the bottom to the pedestal, and which extend at an angle to the guide columns and also to each other. The guide columns are connected to the pedestal by means of flectors of equal height in the form of slots open on the side facing the support elements.

This known device is not suitable for apparatuses for drawing very large crystals, because the individual assemblies of such a large device are too bulky and too heavy for installation in the known support structure, and they are also too difficult of access for the service personnel.

Finally, an older application (DE 195 38 857.7) proposes an apparatus for drawing single crystals from a melt in a crucible under vacuum or under a protective gas at reduced pressure, in which the crucible, which can be heated by the thermal radiation from a heating element, is mounted on a crucible support bolt in a vacuum chamber supported on a stand. A drawing element is provided above the melt, by means of which the crystal can be drawn from the surface of the melt in the upward direction into a transfer lock chamber, which can be pivoted laterally with respect to the base stand. A separation device is also provided between the crystal and the drawing element, which makes it possible to separate the crystal from the drawing element. The base stand consists of a platform supported by posts. Additional legs are supported at three of the four corners of the approximately rectangular platform, which holds the vacuum chamber. The three vertical legs are of equal length and are held together at their top ends by a horizontal frame, which forms a right triangle. The area projected by this frame onto the platform circumscribes approximately half of the area of the platform. A gallows or pivot arm, to which the lock chamber is attached, is supported on at least one of the legs. The pivot arm is parallel to the legs and extends approximately as far as the cover of the vacuum chamber.

The task of the present invention is to create a device of the type described above, by means of which the cover of the vacuum chamber, which is located between the lock chamber and the crucible for melting the silicon, and which seals off the crucible off from above, can be lifted from the vacuum chamber, then pivoted, and finally rotated for the purpose of cleaning. The device is intended to be inexpensive to produce, to require a minimum of space, and to be adjustable in the sense that the cover can be moved by the device into a precisely defined end position.

This task is accomplished in accordance with the present invention by a sleeve, which surrounds the bolt and which can be rotated on it; by projections, which are permanently attached to the sleeve and which extend outward horizontally from it; by a bolt which is held by the projections and which extends transversely to them; and by a housing component in the form of a sleeve, which can pivot around the bolt, where a threaded spindle with a hand lever is mounted in the housing, the spindle being parallel to, and a certain distance away from, the sleeve component of the housing, the spindle cooperating with a nut, which is mounted on the sleeve, and where the sleeve component surrounds a journal, which is rigidly connected to the device part to be lifted or to the cover.

Additional details and features are described herein, and the scope of the invention set forth in the claims.

BRIEF DESCRIPTION OF THE DRAWINGS

The invention can be embodied in a wide variety of ways, one of which is illustrated in purely schematic fashion in the attached drawings:

FIG. 2 shows a side view, on an enlarged scale, of a device for lifting, pivoting, and rotating the cover of the vacuum container of the crystal drawing apparatus according to FIG. 1 in partial cross section; and FIG. 3 shows the housing component of the device according to FIG. 2 from the front.

DETAILED DESCRIPTION OF THE INVENTION

Figure 1:
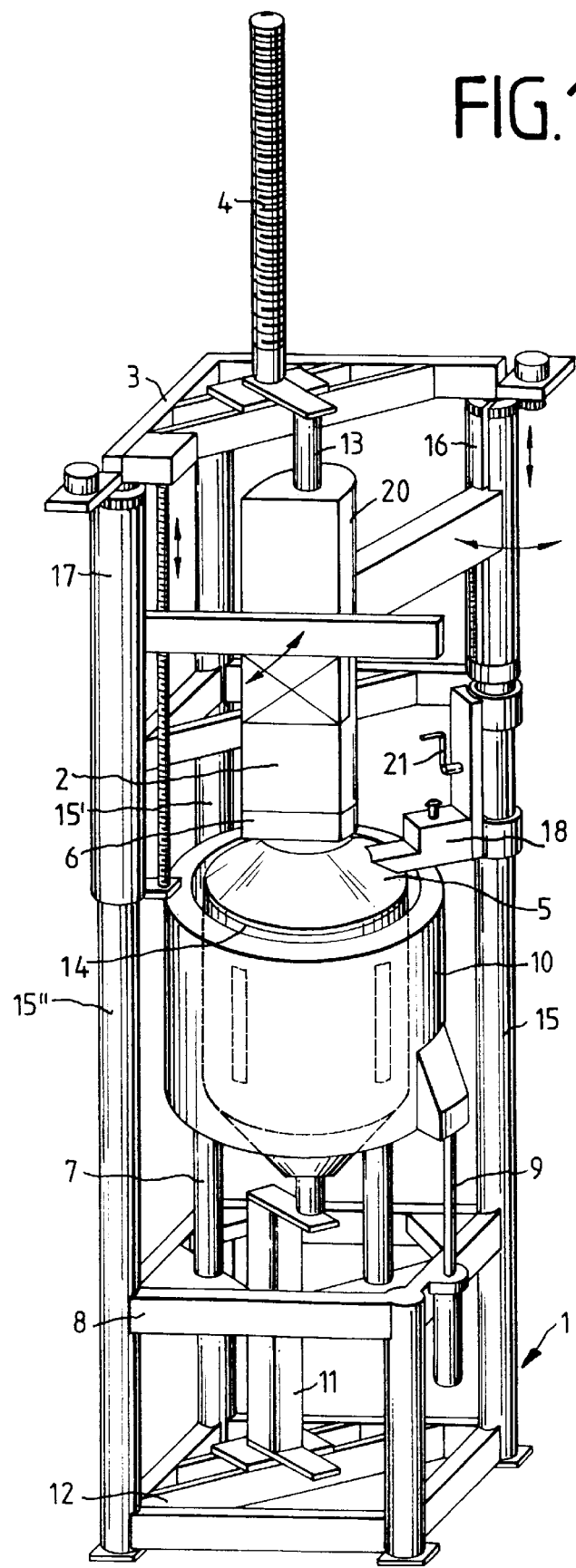
FIG. 1 shows a perspective view of a crystal drawing apparatus.

In the arrangement according to FIG. 1, a triangular top frame 3 is screwed to a four-legged base stand 1, designed as a pipe grid frame, from which three columns extend upward beyond a transfer lock 2. A drawing feed mechanism 4 (rod feed or cable feed) is mounted on this top frame. A cover 5 of the vacuum container, a transfer lock valve 6, and transfer lock 2 are supported by posts 7 on cross connectors 8 of base stand 1. A magnet 10 and its raising and lowering device 9 is also supported on cross connectors 8. Cross connectors 8 are designed and arranged in such a way that magnet 10 can be lowered to allow the apparatus to be maintained and cleaned. Crucible feed mechanism 11 is supported on lower cross connectors 12 of base stand 1. Cover 5, transfer lock valve 6, and transfer lock 2 are separated in terms of vibration and position from feed mechanisms 4, 11 by means of a bellows 13, so that no disadvantageous influence on the drawing process can occur as a result of any vibrations or changes of position which may occur in container components 5, 6, 2.

It is possible for different kinds of functional elements to be integrated into upward-extending columns 15, 15', 15" of base stand 1, e.g., a specially designed handling device 16 for transfer lock 2 and transfer lock valve 6 or for cover 5, for the separating mechanism for the crystal neck, or for holding devices for crystals, as well as handling devices 17 for parts of the container and/or parts of the hot zone within container 14. It is also possible for accessory devices such as loaders or doping devices to be integrated into the columns.

Device 18 shown in FIG. 2 for pivoting and rotating cover 5 is connected to a stationary part of the crystal drawing apparatus, namely, to column 15. During the drawing process, cover 5 is clamped between component 6 above it and component 14 below it. Centering pin 19 for the exact positioning of cover 5 with respect to the center of the apparatus is located opposite lifting, pivoting, and rotating device 18. Also provided for are parts 32,33 (halter) is "fixing or holding device." Each device 32,33, is configured as a "supporting ring" which is mounted for rotation of the column 15 (pillar or column), both devices 32,33, being affixed by the bolt 18. A pair of lungs 32,34' (projections) are fastened to the bolt 18, on which the housing 35,28 (housing) is journaled, namely on a pivot bolt 36.

A second pivot bolt 37 with a threaded spindle permits the housing 35,28, to tilt around the bolt 36.

After the parts located above, namely, transfer lock valve 6 and lock chamber 20, have been lifted off, it is possible by means of lever 21 (or alternatively by means of a hand wheel), which is moved from latch position A to latch position B, for cover 5 to be tipped around center of rotation C. The rotation of lever 21 causes threaded bolt 37 to move in the axial direction, because threaded bolt 37 screws itself into and out of stationary nut 38.

Because of the slight tilt of cover 5, sealing ring 23 is exposed around its entire periphery, and centering pin 19 is moved sufficiently far out of the centering holder.

Cover 5 can now be moved out of the working area by pivoting it around axis of rotation D, consisting of sleeve 24 surrounding column 15, as seen in FIG. 1, or as supported on a bolt 26 with plain bearings and/or an axial thrust bearing 25, as seen in FIG. 2.

To facilitate the cleaning work, it is also possible to loosen wing nut 29 and to rotate cover 5 around its transverse axis Q. This occurs around center of rotation E. Here journal 27 is supported in sleeve component 28 and is secured against moving in the direction of transverse axis Q by a threaded bolt 22, which is guided in a connecting link in sleeve component 28. The connecting link or radial groove (about 90° of the circumference) in sleeve 28, by which threaded bolt 22 is guided, also limits the angle of rotation. Wing nut 29 has a conical shoulder, and the radial groove has a corresponding recess at both ends, so that, when wing nut 29 is tightened, the respective end position is fixed. Wing nut 29 cannot be screwed all the way out.

Journal 27 is connected to cover 5 by locating screws 30,31. Slots are provided for screws 30, so that the position of the cover can be adjusted with respect to stationary part 14 of the apparatus.

What is claimed is:

1. A device for lifting, pivoting, and rotating a heavy piece of equipment, wherein the piece of equipment is used as a cover for a vacuum container of a crystal drawing apparatus, said device comprising:

a stationary part extending in a generally vertical direction;

a sleeve supported on the stationary part so as to be rotatable about a substantially vertical axis;

a projection fixedly attached to the sleeve and extending generally horizontally thereupon;

a pivot bolt supported on the projection and extending transversely with respect thereto;

a housing including a sleeve component supported so as to be pivotable on said pivot bolt;

said housing supporting thereon a threaded spindle having a handle structure adapted to be accessed by an operator to move the spindle, said spindle being spaced from the sleeve component;

a nut fixedly supported on the sleeve and coacting with said spindle so that rotation of said spindle causes movement of the housing about said pivot bolt;

a journal extending within said sleeve component and surrounded thereby, said journal capable of being connected with said piece of equipment.

2. The device according to claim 1, and further comprising:

a second projection fixedly connected with the sleeve and extending substantially horizontally therefrom adjacent a side of the sleeve component opposite to the first projection;

a second pivot bolt supported on the second projection and engaging the sleeve component so that the sleeve component is pivotable relative to the second projection.

3. The device according to claim 1 and said handle structure being a hand lever.

4. The device according to claim 1 and said piece of equipment being a cover for a vacuum container of a crystal drawing apparatus.

5. A device according to claim 4, wherein the journal held by the sleeve component of the housing is adapted to be screwed to the edge part of the cover using a screw joint, the screw joint providing for the cover to be tilted slightly with respect to the longitudinal axis Q of the journal for the purpose of adjustment.

6. A device according to claim 1, wherein the journal surrounded by the sleeve component of the housing can be locked in a bore of the sleeve by a knurled nut or a wing nut, for which purpose the journal is provided with a threaded bolt extending in the radial direction, said bolt being guided in a slot or connecting link in the sleeve component and being configured to be locked in position with respect to the sleeve component by the wing nut.

7. A device according to claim 1, wherein the housing is supported by the projections in such a way that it is able to tilt and has an arm extending substantially vertically and having a free end to which the threaded spindle is attached in such a way that said spindle can rotate but not shift position, said spindle cooperating with said nut mounted on the sleeve.

8. A device according to claim 1, and a substantially vertical bolt supported on the stationary part of the device, said sleeve pivotally engaging said vertical bolt.

9. A device according to claim 8, and a bearing structure providing for pivoting support of the sleeve on a belt.

* * * * *